(12) United States Patent
Chang et al.

(10) Patent No.: US 7,560,172 B2
(45) Date of Patent: Jul. 14, 2009

(54) LOW VOLTAGE CMOS STRUCTURE WITH DYNAMIC THRESHOLD VOLTAGE

(75) Inventors: Yaowen Chang, Hsinchu (TW); Taocheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/584,060

(22) Filed: Oct. 20, 2006

(65) Prior Publication Data

US 2007/0034912 A1    Feb. 15, 2007

Related U.S. Application Data

(62) Division of application No. 10/752,267, filed on Jan. 6, 2004, now Pat. No. 7,141,470.

(51) Int. Cl.
*H01L 21/02* (2006.01)
(52) U.S. Cl. .................. 428/620; 428/621; 428/622; 428/623; 428/457; 428/469; 428/472; 438/585; 438/237; 438/200; 438/210

(58) Field of Classification Search ............... 438/585, 438/237, 210, 200; 428/472, 457, 469, 620, 428/621, 622, 623
See application file for complete search history.

(56) References Cited

U.S. PATENT DOCUMENTS

| 6,262,460 | B1 * | 7/2001 | Kalnitsky et al. | 257/402 |
| 6,624,683 | B1 * | 9/2003 | Bedarida et al. | 327/374 |
| 6,835,624 | B2 * | 12/2004 | Pong et al. | 438/286 |

* cited by examiner

*Primary Examiner*—Leszek Kiliman
(74) *Attorney, Agent, or Firm*—Stout, Uxa, Buyan & Mullins, LLP

(57) ABSTRACT

A method for dynamically varying a threshold voltage of a complimentary metal oxide semiconductor (CMOS) includes providing a substrate pickup formed a semiconductor material type which is complimentary to the semiconductor material type of a well thereof, so as to define a diode. The diode is at least partially turned on, so as to increase the potential of a substrate of the complimentary metal oxide semiconductor and thus reduce the turn-on threshold voltage thereof. The turn-off threshold voltage is approximately unchanged.

11 Claims, 3 Drawing Sheets ial No. 10/752,267, filed Jan. 6, 2004 now U.S. Pat No. 7,141,470,
LOW VOLTAGE CMOS STRUCTURE WITH DYNAMIC THRESHOLD VOLTAGE

CROSS-REFERENCE TO RELATED APPLICATIONS

This application is a divisional of U.S. application Ser. No. 10/752,267, filed Jan. 6, 2004 now U.S. Pat No. 7,141,470, the entire contents of which are hereby incorporated by reference.

BACKGROUND OF THE INVENTION

1. Field of the Invention

The present invention relates generally to semiconductor fabrication methods and, more particularly, to a method for dynamically varying a threshold voltage of a complimentary metal oxide semiconductor (CMOS) or the like so as to reduce the turn-on threshold voltage thereof while leaving the turn-off threshold voltage thereof approximately unchanged.

2. Description of Related Art

A dynamic threshold voltage metal oxide semiconductor field effect transistor (DTMOS) is a well known type of metal oxide semiconductor field effect transistor (MOSFET). DTMOS field effect transistors require a lower threshold voltage ($V_t$) to turn on (when the substrate thereof is appropriately biased, as discussed below) than do standard metal oxide semiconductor field effect transistors. Thus, DTMOS field effect transistors may advantageously be used in the construction of complimentary metal oxide semiconductor (CMOS) devices and the like.

DTMOS field effect transistors have different voltage thresholds for turning the device on and off. The lower turn on voltage threshold facilitates a desirable increase in the on current of the device. The generally unchanged turn off threshold voltage facilitates normal turning off of the device.

When a DTMOS field effect transistor is turned on, the substrate is forward biased, such that a reduced threshold voltage is required for turn on. This reduced turn on threshold voltage inherently results in a corresponding increase in source to drain current ($I_{on}$). As those skilled in the art will appreciate, such increased source to drain current is desirable in many applications.

When a DTMOS field effect transistor is off, the substrate bias is zero and the device therefore maintains the original (standard MOSFET) threshold voltage. The source to drain current in the off state is approximately zero. Dynamic DTMOS field effect transistors thus provide desirably increased source to drain current for the on state ($I_{on}$), while not undesirably compromising source to drain current for the off state ($I_{off}$).

The substrate of a DTMOS field effect transistor must thus be forward biased during turn on, so as to reduce the turn on threshold voltage. Conversely, the substrate must be zero biased during turn off, so as to keep the turn off voltage threshold approximately unchanged (the same as for a standard MOSFET).

The above described reduction in threshold voltage for turning on a DTMOS field effect transistor desirably facilitates the use of such devices in low voltage and low power applications. As those skilled in the art will appreciate, the continuing drive to increase the device density of integrated circuits necessitates that each device generally operate at lower power, so as to mitigate the heat extraction requirements of the integrate circuit. That is, it is generally necessary to reduce the power consumption of metal oxide semiconductor devices in order to increase their density on an integrated circuit chip. Reducing the voltage required to turn on individual devices tends to mitigate the overall power consumption, and consequently the heat extraction required, for a given integrated circuit chip.

One contemporary attempt to provide a DTMOS field effect transistor involves forming the device with the gate and body thereof electrically tied together. However, this approach undesirably requires that the drain voltage ($V_{dd}$) be limited to approximately 0.6V, so as to avoid inadvertent turn on of the parasitic substrate diode defined by such construction. Thus, this contemporary device is only suitable for ultra-low voltage operation.

Another contemporary attempt to provide a DTMOS field effect transistor involves the use of an additional circuit to control the body bias of the device. However, in this instance the additional circuitry inherently increases the complexity of circuits using the device. Such increased complexity undesirably increases costs, decreases yield, and decreases reliability of the integrated circuit chip using the device.

A need thus exists in the prior art to provide an improved DTMOS field effect transistor which does not require a strict limitation on the drain voltage and which does not require the use of additional circuitry.

SUMMARY OF THE INVENTION

The present invention addresses these needs by providing an improved dynamic threshold voltage metal oxide semiconductor (DTMOS) field effect transistor which does not require a strict limitation on the drain voltage and which does not require the use of additional circuitry. Thus, according to the present invention, complexity is reduced and consequently costs, yield and reliability are improved.

According to one aspect, the present invention comprises a metal oxide semiconductor field effect transistor comprising a well, a source formed in the well, a drain formed in the well, a gate formed approximately intermediate the source and drain outside of the well, and a diode defined by the cooperation of a material of the well and a complimentary material formed within the well.

The complimentary material of the diode is preferably in electrical communication with ground. However, the complimentary material need not be directly in electrical contact with ground and need not be exactly at ground potential.

Preferably, the source and the drain comprise N+ type material, the well comprises P type material, and the complimentary material of the diode comprises N+ type material. However, as those skilled in the art will appreciate, various other types of materials are likewise suitable. For example, the source and drain may alternatively comprise P+ type material, the well may alternatively comprise N type material, and the complimentary material of the diode may alternatively comprise P+ type material.

The well, the source, the drain, the gate and the diode are preferably configured for operation with voltages less than approximately 1.8 volt. Thus, the present invention may find beneficial applications in low voltage and low power applications. However, the well, the source, the drain, the gate and the diode may alternatively be configured to operate at voltages greater than approximately 1.8 volt.

According to the present invention, the threshold voltage for an off state thereof is substantially different from a threshold voltage for an on state thereof. Preferably, a threshold voltage for an off state thereof is approximately the same as for a contemporary device lacking the diode and a threshold voltage for an on state thereof is lower than for such a contemporary device. Preferably, the threshold voltage for the off state is approximately the same as for a device lacking the diode when a substrate bias is approximately zero and a threshold voltage for an on state thereof is lower than for a device lacking the diode when the substrate bias is forward biased.

According to the present invention, an on state current of the device is substantially increased due to the lower on state threshold voltage. Since the threshold voltage for the off state of the device is different from the threshold voltage for the on state thereof and since the threshold voltage for the off state is substantially unchanged with respect to contemporary devices, an increase in the on state current may be achieved without substantially (and undesirably) increasing off state current.

Thus, according to the present invention, a threshold voltage for an off state of the device is different from a threshold voltage for an on state thereof such that a dynamic threshold metal oxide semiconductor may be provided.

According to another aspect, the present invention comprises a metal oxide semiconductor field effect transistor comprising a well formed of a first type of semiconductor material, a source formed of a second type of semiconductor material disposed in the well, a drain formed of the second type of semiconductor material disposed in the well, a gate formed of a conductive material disposed proximate (typically above) the well, and a diode formed in the well. The diode is defined by the semiconductor material of the well (which is of the first type) and a second type of semiconductor material formed in or proximate the well.

According to another aspect, the present invention comprises method for dynamically varying the threshold voltage of a complimentary metal oxide semiconductor (CMOS), wherein the method comprises providing a substrate pickup comprising a semiconductor material type which is complimentary to the semiconductor material type of a well thereof, so as to define a diode; and at least partially turning on the diode so as to increase a potential of a substrate of the device and thus reduce a threshold voltage thereof.

According to another aspect, the present invention comprises a method for dynamically varying the threshold voltage of a complimentary metal oxide semiconductor, wherein the method comprises using holes generated from impact ionization to partially forward turn-on a diode so as to raise a potential of a metal oxide semiconductor field effect transistor substrate and thus reduce a threshold voltage thereof.

According to another aspect, the present invention comprises a method for dynamically varying the threshold voltage of a complimentary metal oxide semiconductor, wherein the method comprises providing a diode defined by a reverse polarity substrate pickup and using a hot carrier effect to partially forward turn-on the diode to raise a potential of the substrate of the metal oxide semiconductor field effect transistor and thus reduce a threshold voltage thereof.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
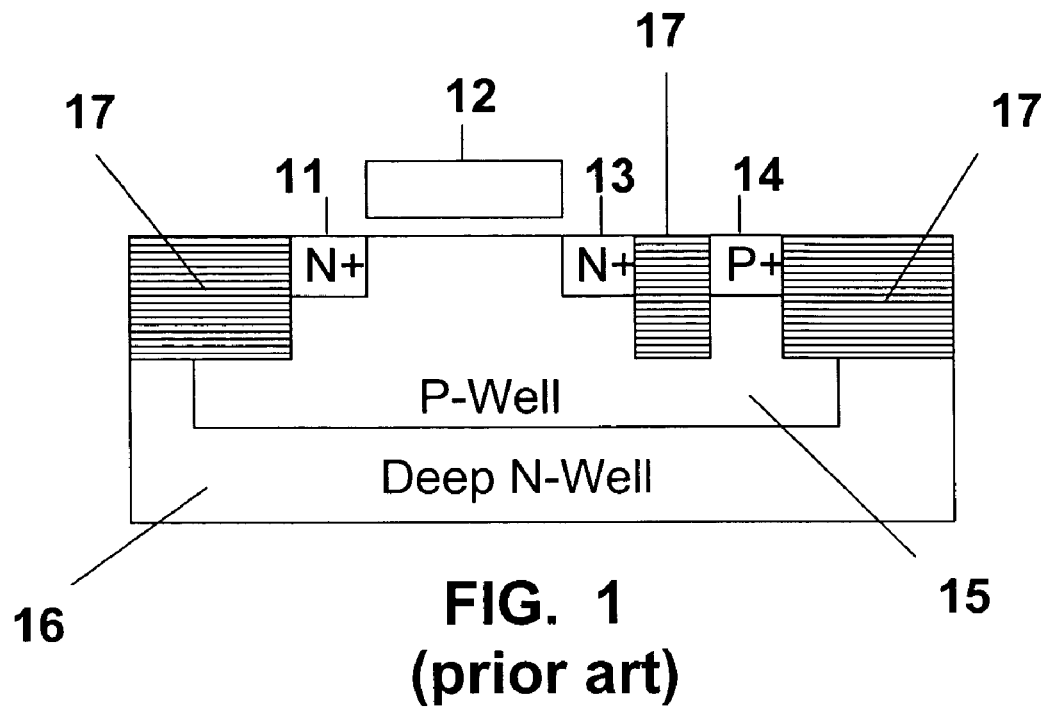
FIG. 1 is a cross-sectional side view of a contemporary metal oxide semiconductor field effect transistor, showing the substrate pickup having the same polarity as the well.

Reference will now be made in detail to the presently preferred embodiment of the invention, an example of which is illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to an illustrated embodiment, it is to be understood that this embodiment is presented by way of example and not by way of limitation. The intent of the following detailed description, although discussing the exemplary embodiment, is to be construed to cover all modifications, alternatives, and equivalents of the embodiment as may fall within the spirit and scope of the invention as defined by the appended claims. It is to be understood and appreciated that the process steps and structures described herein do not cover a complete process flow for the manufacture of a low voltage MOSFET or CMOS structure with a dynamic threshold voltage. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a low voltage MOSFET or CMOS structure with a dynamic threshold voltage.

Referring more particularly to the drawings, FIG. 1 shows a contemporary metal oxide semiconductor field effect transistor which comprises a source 11 and a drain 13 formed within a well 15 according to well known principles. A gate 12 is formed generally intermediate and above the source 11 and the drain 13. The gate 12 is typically formed of a metal, such as aluminum, and is separated from the source 11, the drain 13 and the well 15 by an insulating layer of oxide (not shown).

As shown in FIG. 1, the source 11 and the drain 13 of the device are formed of N+ type material and the well 15 is formed of P type material. In this manner, an n-channel device is defined. However, as those skilled in the art will appreciate, the source 11 and the drain 13 may alternatively be formed of P+ type material and the well may alternatively be formed of N type material, so as to define a p-channel device.

A substrate pickup 14 facilitates electrical connection of the well 15 to ground. It is worthwhile to appreciate that according to contemporary practice the substrate pickup 14 is formed of the same polarity of material (P type material as shown in FIG. 1) as the well 15.

The P type well 15 is typically formed within a larger N type well 16. The metal oxide semiconductor field effect transistor may be electrically isolated from adjacent devices and circuits by field oxide layer 17. A region of the field oxide layer 17 may also electronically isolate the drain 13 from the substrate pickup 14.

Figure 2:
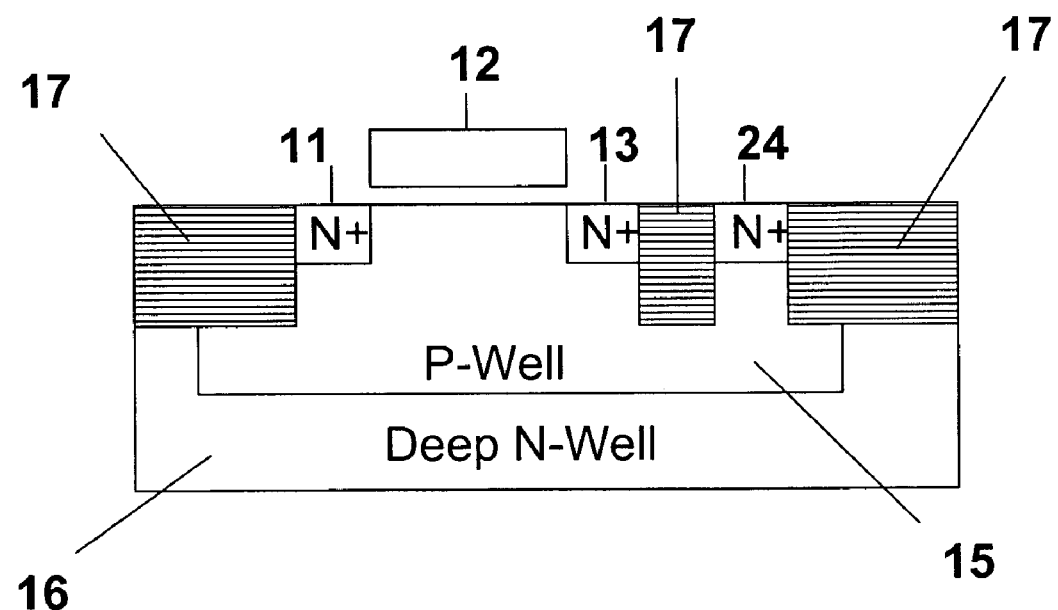
FIG. 2 is a cross-sectional side view of a metal oxide semiconductor field effect transistor according to the present invention, showing the substrate pickup having a polarity opposite that of the well.

Referring now to FIG. 2, a metal oxide semiconductor field effect transistor of the present invention comprises a substrate pickup 24 formed of a complimentary material with respect to the type of material which defines the well 15. Thus, as shown in FIG. 2 the substrate pickup comprises N+ type material since the well 15 comprises P type material. Of course, if the well were instead formed of N type material, then the substrate pickup would alternatively be formed of P+ type material.

The combination of a well 15 of one type of material and a substrate pickup 24 of a complimentary type of material defines a diode. The diode preferably electrically interconnects the body of the device to ground. However, the diode does not necessarily have to electrically interconnect the body of the device to ground and particularly does not have to electrically interconnect the body of the device directly to ground. Generally, it will be desirable in many embodiments to connect the diode to a component or circuit that has an electrical potential approximate that of ground.

Thus, according to the present invention the polarity of the substrate pickup 24 is reversed (with respect to that of a corresponding contemporary device), so as to define a diode. For low power applications, such as applications wherein $V_{dd}$ is less that approximately 1.8 volts, a hot carrier effect is not an issue due to the reduced voltage operation. However, the hot carrier effect still occurs during such low voltage operation.

The hot carrier effect causes the generation of additional holes due to impact ionization which occurs when the device is in the on state. These additional holes slightly forward bias or turn on the diode and thus raise the potential of the intrinsic substrate, consequently resulting in a lower threshold voltage of the device when the device is in the on state. That is, reversing the polarity of the substrate pickup 24 causes the metal oxide semiconductor field effect transistor of the present invention to behave like a contemporary dynamic threshold metal oxide semiconductor.

Figure 3:
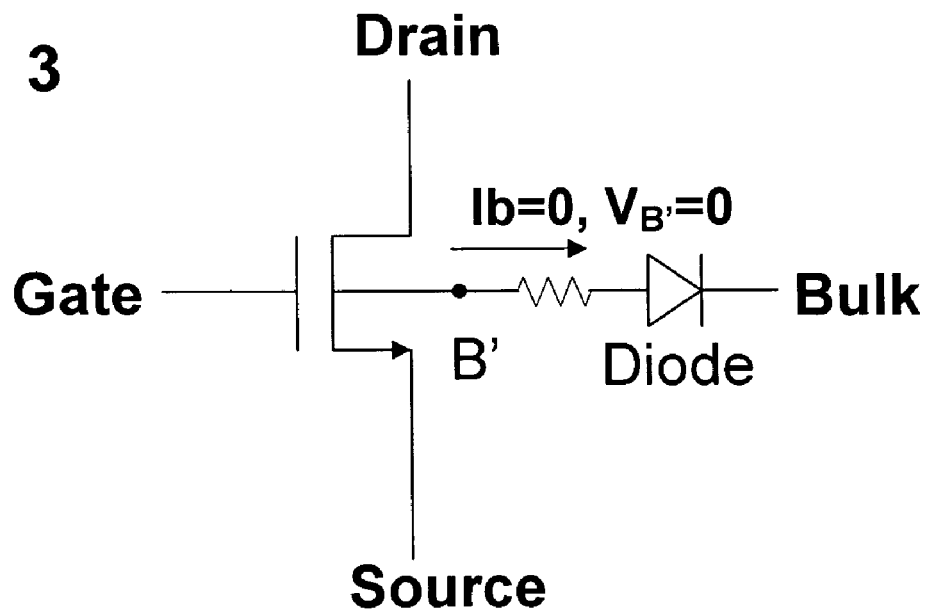
FIG. 3 is a schematic diagram of the metal oxide semiconductor field effect transistor of FIG. 2, showing operational parameters when the device is in the off state.

Turning to FIG. 3, when the device is in the off state, the drain current is approximately zero, the body current ($I_b$) through the diode is approximately zero, and the voltage across the diode ($V_b$) is approximately zero. In this instance (when the device is in the off state), the threshold voltage and the drain current are approximately the same as that of a contemporary device. The body of the device in both FIG. 3 and FIG. 4 is designated as B'.

Figure 4:
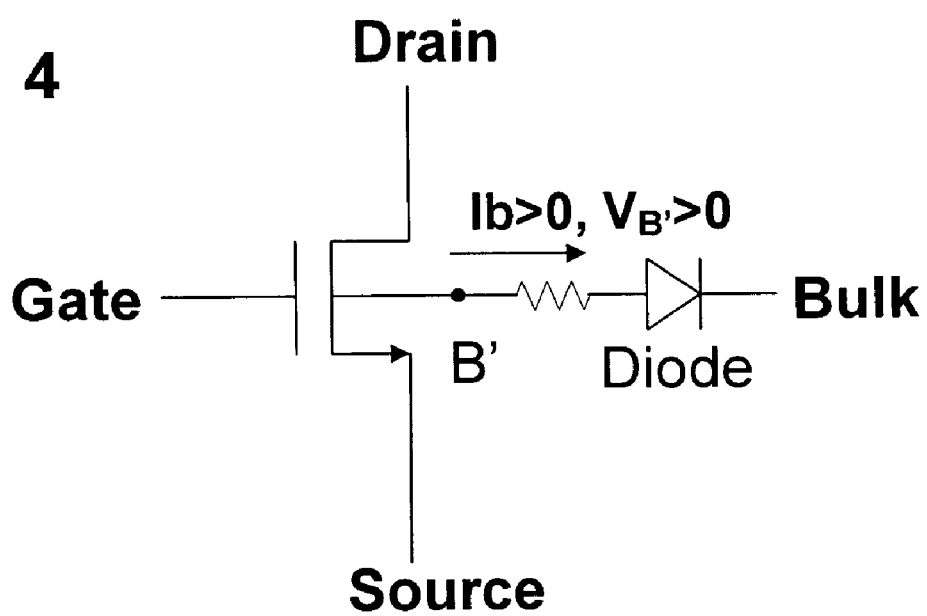
FIG. 4 is a schematic diagram of the metal oxide semiconductor field effect transistor of FIG. 2, showing operational parameters when the device is in the on state.

With reference to FIG. 4, when the device is in the on state, there is drain current which generates some current ($I_b$) through the diode. The current through the diode causes a voltage drop ($V_b$) across the diode. The voltage drop across the diode slightly forward biases the substrate such that the on state threshold voltage is reduced and the drain current is increased.

More particularly, this voltage drop is caused by the hot carrier effect, which as described above causes the generation of additional holes when the device is in the on state. The additional holes slightly forward bias the diode and thus turn the diode on. Turning on the diode consequently raises the potential of the transistor's substrate, so as to result in lowering of the turn-on threshold voltage thereof.

As mention above, the substrate of a DTMOS field effect transistor must be forward biased during turn on, so as to reduce the turn on threshold voltage. The substrate must be zero biased during turn off, so as to keep the turn off voltage threshold approximately unchanged (the same as for a standard MOSFET).

The forward substrate bias is caused by the hot carrier effect when a signal is applied to the gate of the transistor so as to turn the device on. Thus, the substrate is forward biased by the gate signal so as to reduce the turn on threshold voltage.

The substrate bias is removed when the gate signal is discontinued. Discontinuing the gate signal halts the hot carrier effect, and thus causes the turn off voltage threshold to be approximately that of a standard (non-DTMOS) device.

Figure 5:
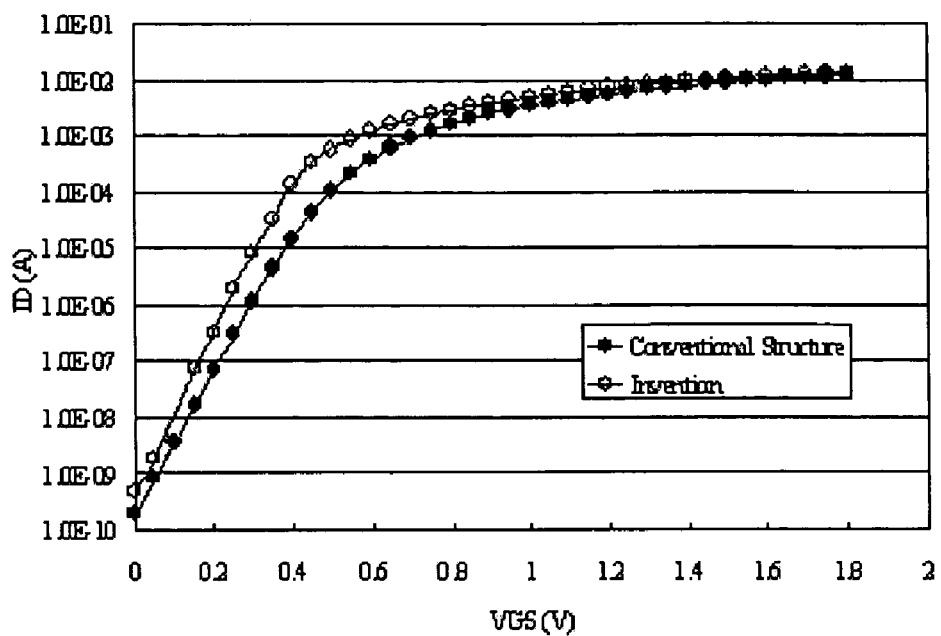
FIG. 5 is a logarithmic current chart of a comparison of drain current between a contemporary metal oxide semiconductor field effect transistor and the metal oxide semiconductor field effect transistor of the present invention, showing that the off state drain current ($I_{off}$) of the two devices is approximately the same for each device.

Referring now to FIG. 5, a logarithmic drain current ($I_d$) versus gate to source voltage ($V_{gs}$) chart shows that off state current ($I_{off}$) is approximately the same for both a contemporary device and a metal oxide semiconductor field effect transistor of the present invention. Thus, according to the present invention, off state current is desirably maintained at approximately its original level, while on state current can be desirably improved (made greater).

Figure 6:
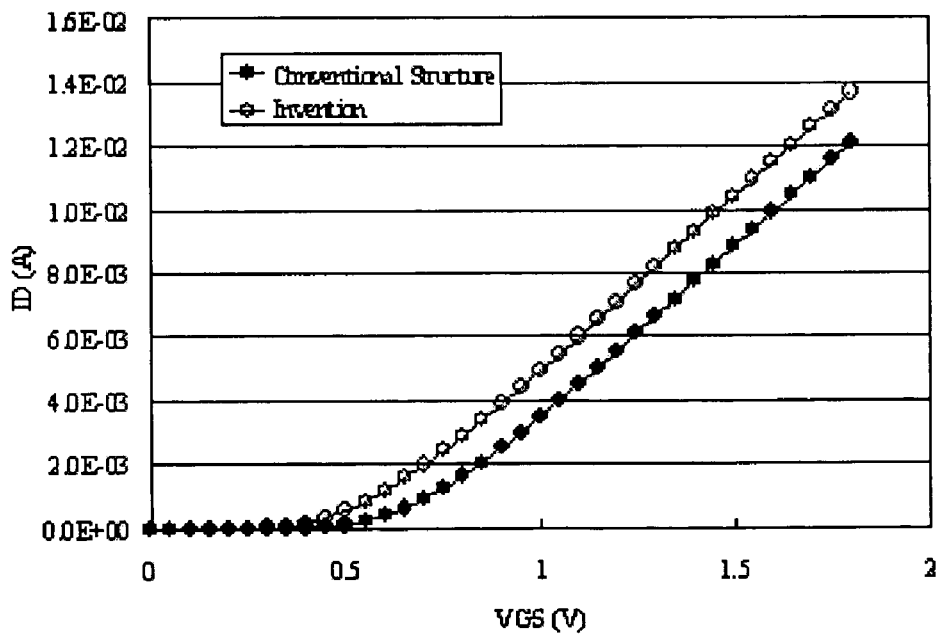
FIG. 6 is a linear current chart of a comparison of drain current between a contemporary metal oxide semiconductor field effect transistor and the metal oxide semiconductor field effect transistor of the present invention showing that the on state drain current ($I_{on}$) of the present invention is improved (greater) than that of the contemporary device.

As can be seen in FIG. 6, a linear drain current ($I_d$) versus gate to source voltage ($V_{gs}$) chart shows that on state current ($I_{on}$) is approximately 13% improved (greater) for a metal oxide semiconductor field effect transistor of the present invention as compared to a contemporary device. Thus, according to the present invention, a dynamic threshold voltage MOSFET is provided. This device has different voltage thresholds when in the on state and in the off state. When in the on state, the substrate bias is forward biased. Because the substrate bias is forward biased, a reduced (with respect to a contemporary MOSFET) threshold voltage is provided.

The reduced threshold voltage facilitates both low voltage/low power operation and increased drain current. Low voltage/low power operation is facilitated because less voltage is required for turning the device on. Low voltage inherently translates to low power in such devices. Increased drain current is facilitated because less gate voltage is required to provide a given level of drain current.

Since the substrate bias is zero when the device is off, the off state voltage threshold is approximately the same as in a contemporary device, and thus there is no substantial change in off state drain current with respect to a contemporary device.

The metal oxide semiconductor field effect transistor of the present invention may be used according to well know principles to form complimentary metal oxide semiconductor (CMOS) transistors or the like.

The present invention thus provides an improved DTMOS field effect transistor which does not require a strict limitation on the drain voltage and which does not require the use of additional circuitry. Thus, the present invention provides a device which can reduce costs, increase yield, and increase reliability with respect to contemporary DTMOS field effect transistors.

In view of the foregoing, it will be understood by those skilled in the art that the methods of the present invention can facilitate formation of various integrated circuit devices, including read only memory devices. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A metal oxide semiconductor field effect transistor comprising:
    a well;
    a source formed in the well;
    a drain formed in the well;
    a gate formed approximately intermediate the source and drain; and
    a diode defined by a material of the well and a complimentary material.

2. The metal oxide semiconductor field effect transistor as recited in claim 1, wherein the complimentary material of the diode is in electrical communication with ground.

3. The metal oxide semiconductor field effect transistor as recited in claim 1, wherein the source and the drain comprise N+ type material, the well comprises P type material, and the complimentary material comprises N+ type material.

4. The metal oxide semiconductor field effect transistor as recited in claim 1, wherein the well, the source, the drain, the gate and the diode are configured for operation with voltages less than approximately 1.8 volt.

5. The metal oxide semiconductor field effect transistor as recited in claim 1, wherein a threshold voltage for an off state thereof is substantially different from a threshold voltage for an on state thereof.

6. The metal oxide semiconductor field effect transistor as recited in claim 1, wherein a threshold voltage for an off state thereof is approximately the same as for a device lacking the diode and a threshold voltage for an on state thereof is lower than for a device lacking the diode.

7. The metal oxide semiconductor field effect transistor as recited in claim 1, wherein a threshold voltage for an off state thereof is approximately the same as for a device lacking the diode when a substrate bias is approximately zero and a threshold voltage for an on state thereof is lower than for a device lacking the diode when a substrate bias is forward biased.

8. The metal oxide semiconductor field effect transistor as recited in claim 1, wherein a threshold voltage for an off state thereof is approximately the same as for a device lacking the diode when a substrate bias is approximately zero and a threshold voltage for an on state thereof is lower than for a device lacking the diode when a substrate bias is forward biased, an on state current being increased due to the lower on state threshold voltage.

9. The metal oxide semiconductor field effect transistor as recited in claim 1, wherein a threshold voltage for an off state thereof is different from a threshold voltage for an on state thereof such that increased on state current is achieved without substantially increasing off state current.

10. The metal oxide semiconductor field effect transistor as recited in claim 1, wherein a threshold voltage for an off state thereof is different from a threshold voltage for an on state thereof such that a dynamic threshold metal oxide semiconductor is provided.

11. A metal oxide semiconductor field effect transistor comprising:
    a well formed of a first type of semiconductor material;
    a source formed of a second type of semiconductor material disposed in the well;
    a drain formed of the second type of semiconductor material disposed in the well;
    a gate formed of a conductive material disposed proximate the well; and
    a diode formed in the well, the diode being defined by the semiconductor material of the well and a second type of semiconductor material formed proximate the well.

* * * * *